United States Patent
Richmond

(10) Patent No.: US 7,433,439 B1
(45) Date of Patent: Oct. 7, 2008

(54) APPARATUS, SYSTEM, AND METHOD FOR SYNCHRONIZING SIGNALS RECEIVED BY ONE OR MORE SYSTEM COMPONENTS

(75) Inventor: Greg J. Richmond, Sunnyvale, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 1022 days.

(21) Appl. No.: 10/325,011

(22) Filed: Dec. 20, 2002

(51) Int. Cl.
H04L 25/00 (2006.01)
(52) U.S. Cl. .................................... 375/371
(58) Field of Classification Search ............... 375/371, 375/376, 354; 327/276, 235
See application file for complete search history.

(56) References Cited

U.S. PATENT DOCUMENTS

| | | | |
|---|---|---|---|
| 5,554,945 A | | 9/1996 | Lee et al. |
| 6,321,076 B1 | * | 11/2001 | Jianqin ..................... 455/323 |
| 6,388,478 B1 | | 5/2002 | Mann |
| 6,393,083 B1 | * | 5/2002 | Beukema .................. 375/371 |
| 6,420,921 B1 | * | 7/2002 | Okayasu et al. ............ 327/276 |
| 6,680,639 B1 | * | 1/2004 | Collier et al. ............... 327/238 |
| 6,859,648 B2 | * | 2/2005 | Hamada et al. ............ 455/302 |
| 2002/0183018 A1 | * | 12/2002 | Veit ........................ 455/102 |

* cited by examiner

Primary Examiner—Khai Tran
(74) Attorney, Agent, or Firm—Kevin L. Daffer; Daffer McDaniel, LLP

(57) ABSTRACT

A phase shift apparatus, system and method are described herein for synchronizing output signals upon one or more components of a synchronous system. In one embodiment, the phase shift apparatus may be implemented as a clock generation circuit, which is configured to provide synchronous clocking signals to one or more components of the synchronous system. In another embodiment, the phase shift apparatus may be implemented as a data interface circuit, which is configured to provide error-free data transmission within a synchronous system. In either embodiment, the phase shift apparatus is configured to shift the plurality of signals by programmable first phase shift amounts prior to shifting the plurality of signals by programmable second phase shift amounts. As such, the phase shift apparatus is adapted to substantially eliminate clock skew, data skew and/ or jitter, which may otherwise adversely affect the synchronous system. In addition, the phase shift apparatus is adapted to provide a phase resolution, which allows accurate control of such timing delays at substantially any operating frequency.

20 Claims, 5 Drawing Sheets

APPARATUS, SYSTEM, AND METHOD FOR SYNCHRONIZING SIGNALS RECEIVED BY ONE OR MORE SYSTEM COMPONENTS

BACKGROUND OF THE INVENTION

1. Field of the Invention

In one embodiment, the invention relates to a phase shift apparatus, and more particularly, to a clock generation circuit configured to generate a plurality of data signals having an adjustable phase relationship. In another embodiment, the phase shift apparatus may be a data interface circuit configured to receive a plurality of data signals from a data bus, and adjust a phase relationship between a clock signal and the plurality of data signals. In either embodiment, the plurality of data signals may be shifted by a first phase shift amount prior to being shifted by a second phase shift amount, such that the shifted data signals may be received by one or more system components at substantially the same time. As such, the phase shift apparatus may be included within any synchronous system or device, such as within a computer system, a data processing system, or a communications system or network.

2. Description of the Related Art

The following descriptions and examples are given as background only.

Many electronic systems include one or more synchronous components that rely on receiving related signals at substantially the same time to maintain proper operating characteristics of the electronic system. Such a synchronous system may be, in one example, a computer system, which typically includes a multitude of interrelated system components each designed to perform a particular operation in response to a clock signal. In some cases, the transfer of data between system components may be synchronized by one or more clock signals originating from a common source. In such a case, the system components may receive the one or more clock signals through a clocking network, which generally includes clock generation and distribution circuits.

In some cases, clock generation is accomplished by manipulating the output of a source, such as a crystal oscillator, to generate a plurality of clock signals according to the needs of various components within the computer system. The generated clock signals may then be fanned out to the system components, via a clock distribution network. In an ideal situation, the generated clock signals may be received simultaneously by each of the system components. In practice, however, timing delays and uncertainties of clock signal generation and distribution may cause the system components to receive clock signals at slightly different instances. In some cases, any variation in the arrival of a clock signal transition relative to a data signal transition may significantly impact system performance and/or reliability.

Such timing delays and uncertainties may include, for example, skewing of the clock signal transition relative to the data signal transitions received by the system components. In general, "skew" may be described herein as a variation in the arrival times between two related signals specified to occur at the same time. In some cases, clock skew may be introduced into the clocking network through load mismatches, routing parasitics (i.e., interlayer dielectric thickness, interconnect thickness and channel length mismatches), and/or variations in temperature, voltage, and process (i.e., trace conductor length, width, and composition mismatches, capacitive loading, etc.).

In some cases, clock skew may affect the timing margins of components within a synchronous system, such as a computer system. In most cases, for example, it is beneficial to properly align the clock and data signals received by the system components to ensure that a transition of the data signal occurs at the proper moment between the edges or active transitions of a clock signal. Synchronous systems, therefore, generally rely on data transitioning and remaining stable from a time at least a "setup time" before a clock transition until at least a "hold time" after the clock transition. Most synchronous system components have stringent setup and hold timing requirements, which are typically specified by a manufacturer of the system component.

As operating speeds increase, however, the setup and hold timing margins between active transitions of the clock and data signals are reduced, thereby decreasing the window within which a data transition can be successfully latched by a clock transition. For example, edge-sensitive flip-flops may be used to sample the data signals received by each of the system components. In such an example, a flip-flop may successfully latch a data signal if the data signal is stable during the critical setup and hold periods on either side of the clock transition. In some cases, however, clock skew may shift the clock transition sufficiently in time to cause a bit error to occur when the data is sampled. A "bit error", as described herein, is a sampling error that occurs when a clock transition incorrectly samples a data signal.

In addition, clock skew may reduce the cycle time in which information can be passed between synchronous elements within a system component, e.g., between pipelined stages within a microprocessor. As operating speeds increase, clock skew may become an increasingly large portion of the total cycle time. When cycle times were 50 ns, for example, clock skew could occupy as much as 20% of the cycle time without degrading system performance. In high-speed systems having cycle times approaching 15 ns or less, however, only 10% of the timing budget may be allocated to clock skew. If clock skew exceeds such an allocated amount, the system will most likely perform unreliably.

In another example, a synchronous system may be any system within which data is transferred from one synchronous device (e.g., a transmitter) to another synchronous device (e.g., a receiver) in response to a clock transition. In general, data signals may be transferred from transmitter to receiver across one or more transmission lines in either a serial or parallel data format. Such a synchronous system may include, for example, data transmission between system components, or alternatively, data transmission within a communications system or network.

In some cases, data transmission within a synchronous system may be conducted over parallel transmission lines, sometimes referred to as a parallel data bus. In addition to clock skew, random noise induced within the parallel data bus may adversely effect data transmission. For example, bit errors may result if a sufficient amount of noise is induced within the parallel data bus when a receiver of the synchronous system samples the data signal. In general, noise may create data skew and/or jitter within one or more paths of the parallel data bus.

Data skew is often defined by variations between one data path and another. Although individual paths of a parallel data bus are generally routed within close proximity to each other, they are often not identical. As such, mismatches may exist between the individual data paths, thereby causing one or more data transitions to be "skewed" relative to the others. In other words, mismatches between individual data paths may cause the data transitions to arrive at slightly different times. Unfortunately, the amount and direction by which a data transition is skewed (i.e., temporally shifted by a positive or negative amount) depends on more than one factor and is often extremely hard, if not impossible, to predict. For example, the amount of data skew may depend on the physical differences between the parallel data paths, such as trace length, width, and composition mismatches, capacitive loading, etc. In addition, the amount of data skew may depend on the operating speed of the system, and in some cases, may increase as operating speeds increase.

Jitter, on the other hand, applies only to an individual path of the parallel data bus and generally results from time-varying components of noise sources. Jitter is often defined as the cycle-to-cycle variation in the "threshold crossings" of the data. In other words, jitter results in data samples taken near, but not exactly at, the desired sample locations of an individual data signal, such that a sample is temporally displaced by an unknown, though usually small interval (e.g., an interval substantially less than or equal to one clock cycle). As such, the overall effect of jitter is to shift a data signal sufficiently in time to cause incorrect sampling of the data signal by the clock signal, and thus, produce a bit error.

As such, numerous techniques have been used in an effort to minimize the effects of timing delays, e.g., clock skew, data skew, and jitter, which often lead to degradation in performance and reliability of a synchronous system. Most techniques, however, cannot in all conditions ensure that a data signal transition will occur at the critical moment between clock signal edges. In a semiconductor device, for example, one or more transmission lines may be routed having excess line lengths in an attempt to compensate for skew introduced by board trace length mismatches (i.e., mismatches in transmission line lengths between transmitting and receiving portions of a synchronous system). Such a technique, however, may disadvantageously increase the amount of noise introduced into the system (e.g., due to increased electromagnetic interference resulting from the increased line length). In addition, such a technique may introduce an amount of delay that is undesirably fixed by the circuit design and cannot be changed by a user of the system.

In another example, a variable number of active delay elements, such as buffers or inverters, may be included within individual transmission lines to impart a different amount of delay to each line. The amount of delay included within each line, however, may be undesirably fixed by the circuit design and cannot be changed by a user of the system. Therefore, each of the techniques described above suffer from the inability to control timing delays after board manufacture. In particular, the above techniques suffer from the inability to control timing delays due to temperature, voltage, and process, and thus, often lead to poor accuracy. In addition, the above techniques often increase the financial cost, power, and area consumed by the synchronous system.

In an alternative example, a phase-locked loop (PLL) or delay-locked loop (DLL) device may be used to generate and select a phase for shifting a clock signal transition relative to the data signal transitions received by the synchronous system. In general, a PLL is a closed-loop device that uses a voltage-controlled oscillator (VCO) to obtain accurate phase and frequency alignment between feedback and reference signals. A DLL device, on the other hand, generally differs from a PLL device in that it uses a delay line instead of a VCO to obtain accurate phase and frequency alignment between feedback and reference signals. As such, a PLL or DLL may beneficially provide a slightly variable, though highly consistent, amount of phase delay by which to shift the clock signal transition.

In general, a PLL or DLL may provide an incremental amount of delay, or phase resolution, which is inversely proportional to the number of stages, N, included within the oscillator or delay line. Unfortunately, the number of stages allowed within the oscillator or delay line is often limited by the maximum operating frequency, $F_{MAX}$, of the PLL or DLL. In this manner, a PLL or DLL may provide a phase resolution of approximately $1/(2*F_{MAX}*N)$, or the minimum delay of one stage, which in current technology may be about 50 picoseconds to about 150 picoseconds. As stated above, however, the window within which a data transition can be successfully latched by a clock transition decreases as operating speeds of synchronous systems increase. Therefore, a PLL or DLL device may not provide sufficient phase resolution for accurately controlling the timing delays between related signals within high-speed synchronous systems.

Therefore, it would be beneficial to provide an improved phase shift apparatus, which would preferably reduce the effects of clock skew, data skew and jitter within and/or between synchronous systems. In addition, the improved phase shift apparatus would provide a programmable means for controlling timing delays after manufacturing of the synchronous system. Furthermore, the improved phase shift apparatus would exhibit significantly increased accuracy and phase resolution over conventional solutions. Moreover, the improved phase shift apparatus would consume substantially less power and area, and cost less than conventional solutions.

SUMMARY OF THE INVENTION

In general, the problems outlined above may be in large part addressed by a phase shift apparatus that adjusts a phase relationship of a plurality of signals to be received by one or more synchronous system components at substantially the same time. In particular, the phase shift apparatus is configured to shift the plurality of signals by programmable first phase shift amounts prior to shifting the plurality of signals by programmable second phase shift amounts. In this manner, the phase shift apparatus is adapted to minimize clock skew, as well as compensate for noise components, such as data skew and jitter, which may affect one or more paths of a clock and/or data bus. In addition, the phase shift apparatus is adapted to provide a phase resolution, which enables the phase shift apparatus to control timing delays within a synchronous system having components that operate at substantially any frequency.

In one embodiment, the phase shift apparatus may be implemented as a clock generation circuit. In such an embodiment, the clock generation circuit may generate a plurality of data signals for clocking the one or more synchronous system components at substantially the same time, regardless of dissimilar trace conductor lengths between the clock generation circuit and the one or more system components. By adjusting the phase of each of the plurality of data signals independent of one another, the one or more system components may simultaneously receive the plurality of data signals from a clock distribution network. As such, the clock generation circuit advantageously provides synchronous clocking signals despite timing delays that may be present along individual paths of the clock distribution network.

In another embodiment, the phase shift apparatus may be implemented as a data interface circuit. In such an embodiment, the data interface circuit may receive, from a parallel data bus, a plurality of data signals having dissimilar transition times. By adjusting the phase of each of the plurality of data signals independent of one another, the plurality of data signals can be accurately sampled by the data interface circuit. As such, the data interface circuit provides error-free data transmission regardless of different timing delays along the clock and/or data paths.

In general, the phase shift apparatus described herein is configured to receive at least one input signal and to shift the at least one input signal by a first phase shift amount to produce a shifted input signal. In addition, the phase shift apparatus is configured to further shift the shifted input signal by a second phase shift amount to produce at least one output signal. In some cases, the at least one input signal comprises a plurality of input signals. In the embodiment of a clock generation circuit, for example, the at least one input signal may be a reference clock signal that is used to generate a plurality of data signals for clocking one or more synchronous system components. In the embodiment of a data interface circuit, the at least one input signal may alternatively include a plurality of data signals received from a data bus, where at least two of the plurality of data signals are phase offset from each other (i.e., at least two of the plurality of data signals have dissimilar arrival times).

In either embodiment, the first phase shift amount may differ for each of the plurality of data signals, in some cases. Likewise, the second phase shift amount may differ for each of the plurality of data signals, in some cases. In other cases, however, the first phase shift amount and/or the second phase shift amount may be similar for at least two of the plurality of data signals. In this manner, each of the plurality of data signals may be shifted independent of one another by similar or dissimilar phase shift amounts, according to the amount of skew to be compensated for within each clock and/or data path. As such, the phase shift apparatus described herein advantageously provides accurate control of timing delays along clock and/or data paths within a synchronous system.

In particular, the phase shift apparatus may include a phase generator configured to receive a reference clock signal and, in response, produce a plurality of time delay pulses. In some cases, the phase shift apparatus may include a data generation circuit configured to generate a plurality of data signals shifted independent of one another by similar or dissimilar first phase shift amounts. In other cases, however, the phase shift apparatus may include a data recovery circuit configured to receive a plurality of data signals from a data bus. In such a case, the data recovery circuit may also be configured to shift each of the plurality of data signals independent of one another by similar or dissimilar first phase shift amounts. In either case, the phase shift apparatus may include a configuration register coupled to programmably select each of the first phase shift amounts from a subset of the plurality of time delay pulses produced by the phase generator.

In addition, the phase shift apparatus may include at least one phase shift circuit coupled to receive the plurality of time delay pulses and, in response, produce an output signal by further shifting one of the plurality of data signals by a second phase shift amount. Preferably, the phase shift apparatus includes a plurality of phase shift circuits each configured to further shift a different one of the previously shifted plurality of data signals by a similar or dissimilar second phase shift amount. Whatever the case may be, a phase shift circuit is preferably configured to derive a second phase shift amount according to a weighted average of at least two of the plurality of time delay pulses. In this manner, the phase shift apparatus described herein advantageously provides a phase resolution, which allows accurate control of timing delays along clock and/or data paths within a synchronous system having components that operate at substantially any frequency.

The configuration register described above may also be coupled to programmably select at least two of the plurality of time delay pulses for each of the plurality of phase shift circuits. In addition, the configuration register may further be coupled to programmably select a weight factor for determining the weighted average derived by each of the plurality of phase shift circuits. Thus, the phase shift apparatus described herein advantageously provides a programmable means for accurately controlling timing delays along individual clock and/or data paths within a synchronous system. In some cases, the programmable means is accessible to a user of the system for controlling timing delays after manufacturing of the system.

A system is also contemplated herein. In general, the computer system includes a phase shift apparatus coupled to a plurality of system components via a plurality of trace conductors. In some cases, the phase shift apparatus includes a data generation circuit configured to generate a plurality of data signals shifted independent of one another, depending on a plurality of time delay pulses output from a phase generator. In particular, the plurality of data signals may be generated as periodic data signals for clocking the plurality of system components. In addition, the phase shift apparatus may include a plurality of phase shift circuits each configured to further shift a different one of the shifted plurality of data signals according to a weighted average of at least two of the plurality of time delay pulses. In this manner, the plurality of system components may be coupled to receive the further shifted plurality of data signals at approximately the same time, regardless of dissimilar trace lengths between the plurality of trace conductors.

Within the system, the phase shift apparatus may also include a configuration register coupled to supply a first set of programmable control signals to the data generation circuit and a second set of programmable control signals to the plurality of phase shift circuits. Based upon the first set of programmable control signals, the data generation circuit may be configured to generate each of the plurality of data signals having a frequency substantially equal to an operating frequency of a different one of the plurality of system components. The data generation circuit may further be configured to generate each of the plurality of data signals having a first phase shift amount based upon the first set of programmable control signals. Based upon the second set of programmable control signals, however, the plurality of phase shift circuits may each be configured to select at least two of the plurality of time delay pulses and a weight factor. As such, the plurality of phase shift circuits may be individually programmed to calculate the weighted averages, or second phase shift amounts, used to further shift the shifted plurality of data signals.

A method for synchronizing output signals upon a pair of system components is also contemplated herein. In general, the method includes generating a plurality of time delay pulses. In addition, the method may include phase shifting a pair of data signals independent of one another. In some cases, the step of phase shifting a pair of data signals includes selecting, from a subset of the plurality of time delay pulses, at least one time delay pulse by which to phase shift at least one of the pair of data signals.

Furthermore, the method may include generating a pair of output signals by further phase shifting, independent of one another, the previously phase shifted pair of data signals. In some cases, the step of generating a pair of output signals includes determining a weighted average of at least two of the plurality of time delay pulses to further phase shift at least one of the previously phase shifted pair of data signals by the weighted average. Thus, the method described herein advantageously provides a two-step phase shifting process for synchronizing output signals upon a pair of system components.

In general, the two-step phase shifting process synchronizes the output signals by substantially eliminating timing delay mismatches that may exist between the pair of system components.

BRIEF DESCRIPTION OF THE DRAWINGS

Other objects and advantages of the invention will become apparent upon reading the following detailed description and upon reference to the accompanying drawings in which.

Figure 1:
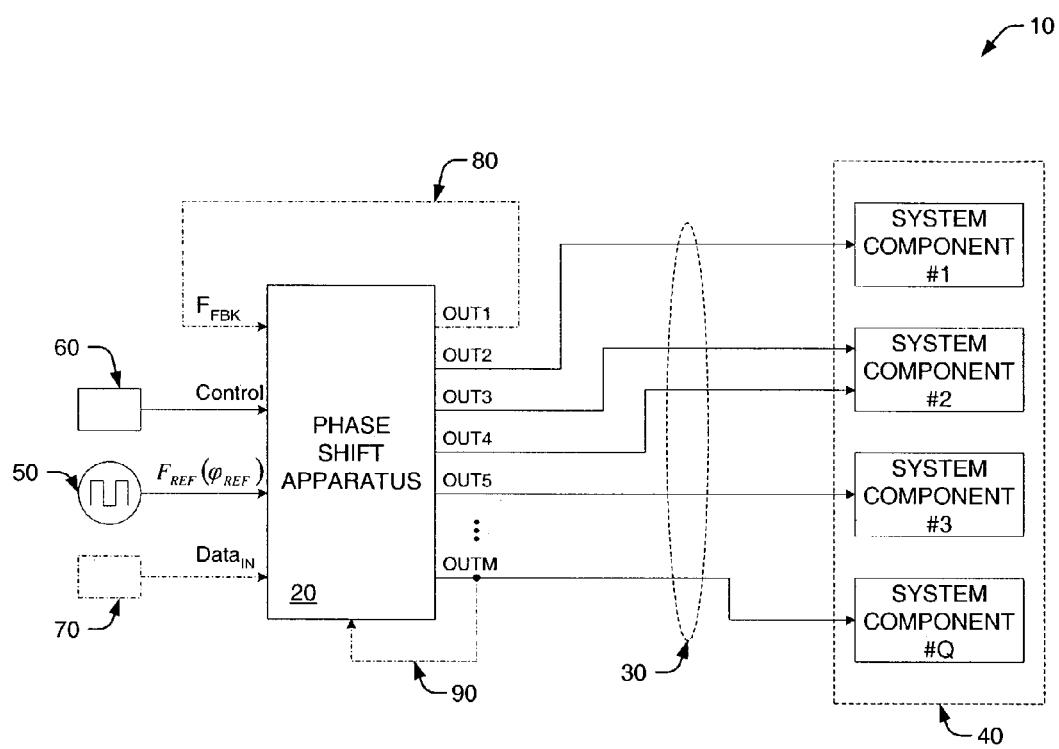
FIG. 1 is a block diagram illustrating one embodiment of a computer system including a plurality of system components each coupled to receive a signal output from a phase shift apparatus at substantially the same time.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates system 10 according to a preferred embodiment of a synchronous system. As shown in FIG. 1, system 10 includes phase shift apparatus 20, which is coupled to one or more system components 40 via one or more trace conductors 30. In general, phase shift apparatus 20 is coupled to receive a reference clock signal, having a reference frequency ($F_{REF}$) and phase ($\phi_{REF}$), from clock source 50. Popular clock sources may include RC oscillators or LC oscillators, which are fairly stable at relatively high frequencies. However, clock source 50 may alternatively include a crystal oscillator or a surface acoustic wave oscillator in systems that require greater stability at even higher frequencies. Thus, clock source 50 may be any source capable of generating a stable reference signal at a known frequency.

In one embodiment, phase shift apparatus 20 is configured to generate a plurality of output signals for synchronously clocking one or more system components 40. As such, phase shift apparatus 20 and trace conductors 30 may be implemented as a clock generation and distribution network within system 10. In an exemplary embodiment in which system 10 is a computer system, system components 40 may include synchronous elements within a microprocessor, such as a prefetch unit, a cache memory device, and/or various registers, decoders and counters within the central processing unit (CPU). Alternatively, or in addition, system components 40 may include synchronous components external to a microprocessor, such as primary or secondary memory devices, input/output devices, or other peripheral devices.

In this manner, one or more of trace conductors 30 may be routed having dissimilar lengths, so as to couple each of system components 40 to phase shift apparatus 20 within the constraints of the system layout. Unfortunately, dissimilar trace conductor lengths often lead to dissimilar timing delays within individual trace conductors of the clock distribution network. As will be described in more detail below, phase shift apparatus 20 is preferably configured to substantially eliminate these timing delays, such that system components 40 receive the plurality of output signals at substantially the same time.

System 10 may also include a programmable means for accurately controlling timing delays that may be present along trace conductors 30. As such, phase shift apparatus 20 may be configured to receive control signals from programmable means 60. In some cases, programmable means 60 may include, for example, a set of dedicated input/output (I/O) pins within a Joint Test Action Group (JTAG) test access port or within an $I^2C$ bus interface. Alternatively, programmable means 60 may include any number of I/O pins necessary to convey the control signals to phase shift apparatus 20. In other cases, however, programmable means 60 may include a non-volatile storage device, such as a read-only memory (ROM) device or a programmable read-only memory (PROM) device. However, programmable means 60 preferably includes a reprogrammable non-volatile storage device, such as a non-volatile random access memory (NVRAM) device, an erasable programmable read-only memory (EPROM) device, an electrically erasable programmable read-only memory (EEPROM) device, or a FLASH memory device. In such a case, programmable means 60 advantageously allows a user of the synchronous system to accurately control timing delays in a post-manufacturing environment.

In the current embodiment, programmable means 60 may also be configured to select a particular frequency for each of the plurality of output signals (i.e., OUT1 . . . OUTM) generated by phase shift apparatus 20. In some cases, programmable means 60 may provide phase shift apparatus 20 with control signals for generating the plurality of output signals having a frequency substantially equal to an operating frequency of a different one of system components 40. In other cases, however, the control signals from programmable means 60 may be used to generate one or more of the plurality of output signals having a similar frequency. In this manner, programmable means 60 advantageously allows a user of the synchronous system to accurately control timing delays between synchronous signals having similar or dissimilar frequencies.

In any case, each of the plurality of output signals may be generated to have a frequency substantially above or substantially below the reference frequency ($F_{REF}$). In order to maintain a known phase relationship between the reference frequency and the plurality of output signals, however, at least one of the output signals may be fed back to phase shift apparatus 20 via feedback path 80. In some cases, feedback path 80 may be routed within phase shift apparatus 20 (i.e., on-chip). In other cases, however, feedback path 80 may be routed external (i.e., off-chip) to phase shift apparatus 20, as shown in FIG. 1.

Figure 2:
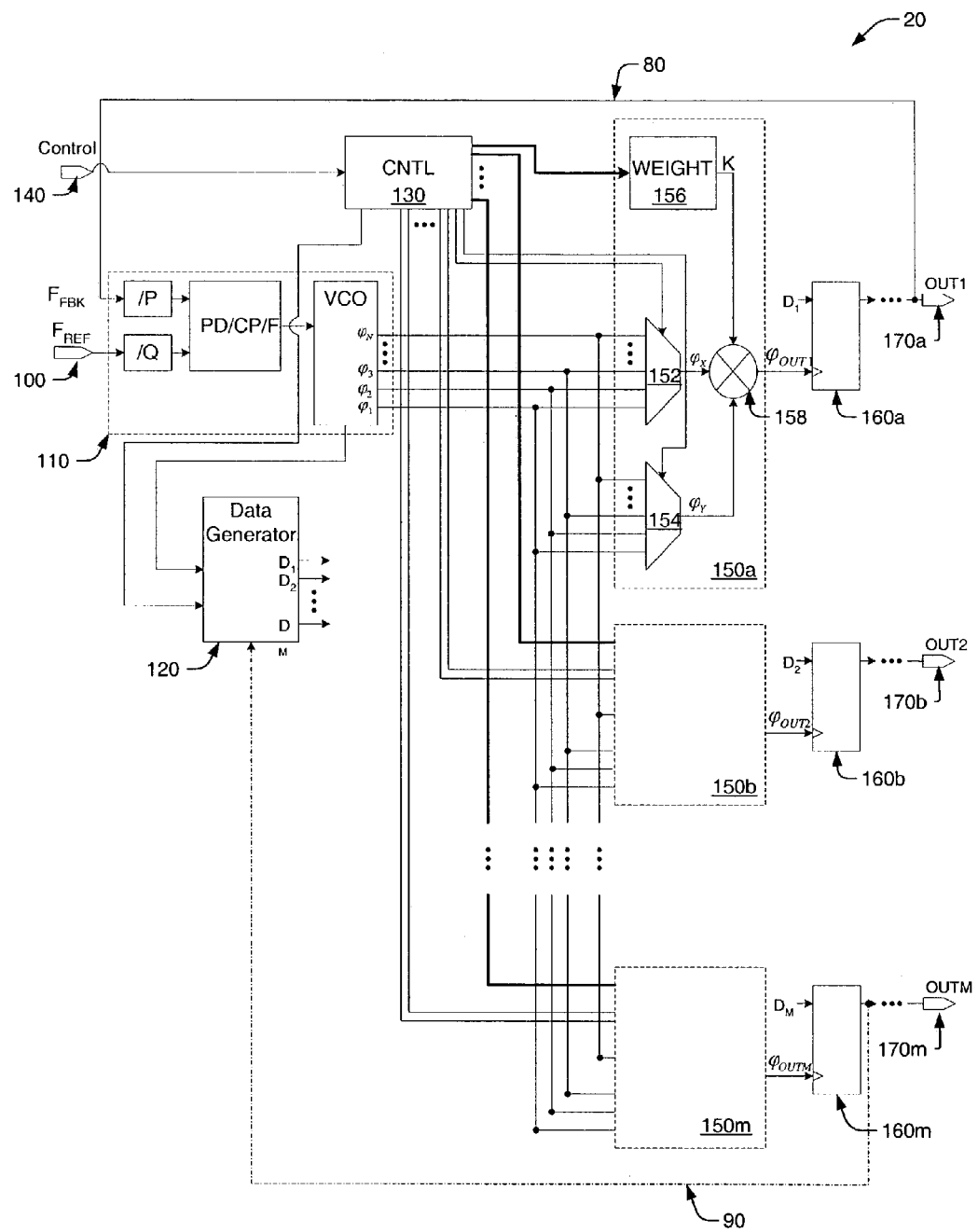
FIG. 2 is a block diagram illustrating one embodiment of a phase shift apparatus for generating a plurality of data signals, each having a programmable frequency and phase relationship, to be received by the plurality of system components of FIG. 1.

In addition, system components 40 may be coupled to receive one or more of the plurality of output signals. As shown in FIG. 2, for example, system components 40 may be coupled to receive one or more of the plurality of output signals via output pins 170. In some cases, a different one of the plurality of output signals may be coupled to a different one of system components 40. In other cases, however, two or more of the plurality of output signals may be coupled to the same system component, as illustrated in FIG. 1 by the coupling of output signals OUT3 and OUT 4 to system component #2. In any case, system components 40 may receive the plurality of output signals at substantially the same time for the purpose of synchronizing a clocking event within each of system components 40.

To further ensure synchronous clocking events, feedback path 80 may be routed having a trace length substantially similar to a trace length of one of trace conductors 30 (as shown in FIG. 1). Assume, for example, a trace conductor routed six inches in length is used to couple system component #1 to phase shift apparatus 20. In addition, assume that it is favorable to match the frequency and phase of system component #1 to the reference clock signal input to phase shift apparatus 20. In such an example, the output signal, OUT2, can be adjusted to synchronize system component #1 with the reference clock signal by routing feedback path 80 to have a trace length substantially equal to six inches. In this manner, feedback path 80 may additionally be used to compensate for board trace delays and impedance variations.

In addition, optional feedback path 90 may be included, in some cases, to compensate for internal timing delays that may be introduced by the circuitry within phase shift apparatus 20. As such, optional feedback path 90 may advantageously increase the accuracy of phase shift apparatus 20 by maintaining setup and hold timing requirements of output latches 160. Optional feedback path 90 is generally routed internal to phase shift apparatus 20, however, alternative routing configurations are also possible.

A simplified circuit diagram representing the current embodiment of phase shift apparatus 20 is illustrated in FIG. 2. In general, FIG. 2 illustrates phase shift apparatus 20 as an exemplary implementation of a clock generation circuit. As such, phase shift apparatus 20 may include one or more input pins 100 for receiving a reference clock signal, having a reference frequency ($F_{REF}$) and phase ($\phi_{REF}$), from a clock source, such as clock source 50 of FIG. 1. In addition, phase shift apparatus 20 includes phase generator 110 for receiving the reference clock signal. In response to receiving the reference clock signal, phase generator 110 is configured to generate a plurality of time delay pulses related to the reference clock signal.

For example, phase generator 110 may be fabricated as a delay-locked loop (DLL, not shown) device, in some cases. Generally, a DLL is a closed-loop device that, in it's simplest form, consists of a variable delay line and control logic. Variable delay lines can be built using a voltage-controlled delay, or alternatively, using a series of discrete delay elements. In this manner, a DLL works by inserting an amount of delay between the reference clock signal and a feedback clock signal until transitions of the two signals align, usually 360° out of phase with one another. Once a transition of the feedback signal aligns with a transition of the reference clock signal, the DLL "locks" the phase of the DLL output clock.

In other cases, however, phase generator 110 may be fabricated as a phase-locked loop (PLL) device, as shown in FIG. 2. A fundamental difference between a PLL and a DLL device is that instead of a delay line, a PLL uses a voltage-controlled oscillator (VCO) to generate one or more phases (i.e., time delay pulses), which are related to the phase of the reference clock signal. In general, a PLL may include four main components, such as a phase frequency detector (PD), a charge pump (CP), a filter (F), and a VCO, in some cases. In particular, the phase frequency detector is coupled to receive and compare the reference clock signal to a feedback signal output by the VCO. In response to frequency and/or phase differences between the signals, PLL control logic (e.g., PD/C/F) is adapted to adjust the frequency and phase of the oscillator clock (i.e., the feedback clock output from the VCO) until the rising edge of the feedback clock aligns with the rising edge of the reference clock. At such a time, the PLL "locks" the phase of the PLL output clock.

The closed-loop device ultimately chosen to represent phase generator 110 may depend on the specifications of the synchronous system. For example, PLL devices are often used as frequency multipliers, and thus, can be used to generate phases at relatively low to relatively high operating speeds (e.g., operating frequencies ranging from a few hundred Hertz (Hz) to approximately 40 GHz or above). In particular, PLL devices can operate at speeds substantially above or below the reference frequency supplied by the reference clock. On the other hand, DLL devices typically operate at lower operating speeds (e.g., operating frequencies ranging from a few hundred Hertz to a few Gigahertz) than PLL devices. In particular, DLL devices generally exhibit operating speeds substantially equal to or below the reference frequency, and thus, generally consume less power than high-speed PLL devices. In addition, DLL devices are typically first order systems, which are substantially easier to implement than PLL devices. Furthermore, DLL devices do not suffer from jitter accumulation often introduced by the VCO of a PLL device. Therefore, phase generator 110 may be implemented as a DLL device, in the case that low power, low jitter, and ease of implementation are design considerations. Otherwise, phase generator 110 may be implemented as a PLL device in the case that maximum operating speed is design consideration. Alternatively, phase generator 110 may be implemented as any other device capable of producing one or more signals having an offset phase relationship. Note, however, that phase generator 110 is described herein as a PLL device for the sake of brevity.

As described above, phase generator 110 is adapted to generate a plurality of phases, or time delay pulses. In some cases, phase generator 110 may be adapted to generate N number of phases, which are denoted $\phi_1$ to $\phi_N$, as shown in FIG. 2. In some cases, the N number of phases may be equally arranged about the reference clock phase, $\phi_{ref}$. In such a case, approximately half of the N number of phases will be substantially greater than and approximately half of the N number of phases will be substantially less than the reference clock phase.

For example, each of the N number of phases may be separated by an incremental phase amount, $\phi_{ref}/N$, such that a "positive" incremental phase provides a time delay pulse, which lags the reference clock phase by an integer multiple of the incremental phase amount. In such an example, a "negative" incremental phase may provide a time delay pulse, which leads the reference clock phase by an integer multiple of the incremental phase amount. In addition, a "zero" incremental phase provides a time delay pulse substantially equal to the reference phase. Thus, phase generator 110 is adapted to provide a plurality of time delay pulses for shifting a signal in phase along either a positive or negative direction. In other cases, however, the reference clock phase, $\phi_{ref}$, may be substantially equal to a first output phase, $\phi_1$, a last output phase, $\phi_N$, or any other phase in between $\phi_1$ and $\phi_N$.

As shown in FIG. 2, phase shift apparatus 20 also includes data generation circuit 120. In general, data generation circuit 120 may be configured to receive a subset of the plurality of time delay pulses generated by phase generator 110, in some cases. A subset of the time delay pulses may include a number of phases separated by a common phase amount, in some cases. In one example, a subset may include a number of phases separated by 90°, such as phases 0°, 90°, 180° and 270°. In other cases, however, a subset of the time delay pulses may include a number of phases separated by one or more dissimilar phase amounts (e.g., 0°, 45°, 90°, 180° and 270°). Alternatively, data generation circuit 120 may be configured to receive substantially all of the plurality of time delay pulses generated by phase generator 110. In any case, the number of phases and the separation between phases may be chosen based on the specifications of a particular synchronous system.

As shown in FIG. 2, the time delay pulses received by data generation circuit 120 may be used to generate a plurality of data signals, denoted as $D_1, D_2 \ldots D_M$. In addition, data generation circuit 120 may be configured to generate the plurality of data signals, such that a phase of each of the plurality of data signals either lags or leads the reference clock phase by one of the received time delay pulses. In some cases, each of the plurality of data signals may be shifted in phase by a different phase shift amount (i.e., shifted by a different received time delay pulse). In other cases, however, two or more of the plurality of data signals may be shifted in phase by a similar phase shift amount. In any case, data generation circuit 120 is preferably configured to shift each of the plurality of data signals independent of one another by a (positive or negative) first phase shift amount.

To determine the independently shifted first phase shift amounts, phase shift apparatus 20 preferably includes control circuitry 130. In some cases, control circuitry 130 includes a bank of configuration registers coupled to store a set of control signals. As such, configuration registers 130 may receive the set of control signals through one or more control input pins 140. In this manner, control input pins 140 may be coupled to receive the set of control signals from programmable means 60, as described above in reference to FIG. 1. In other cases, control circuitry 130 may alternatively be implemented as an on-chip non-volatile storage device, and more particularly, as a reprogrammable on-chip non-volatile storage device, such as those described above in reference to FIG. 1. In any case, data generation circuit 120 may be coupled to receive a first set of control signals from control circuitry 130.

Figure 4A:
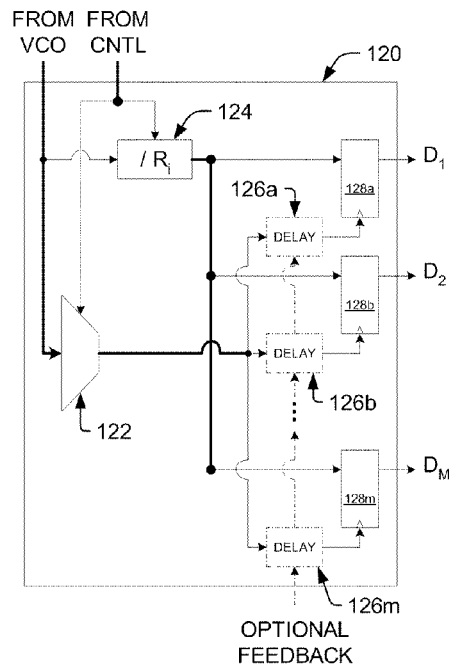
FIG. 4A is a block diagram illustrating an exemplary data generation circuit, as included within the phase shift apparatus of FIG. 2.

FIG. 4A illustrates an exemplary implementation of data generation circuit 120. As shown in FIG. 4A, data generation circuit 120 may include multiplexor (MUX) 122 for receiving the subset of time delay pulses from phase generator 110. Based upon the first set of control signals received from control circuitry 130, MUX 122 is configured to select, from the subset of time delay pulses, a first phase shift amount to be applied to the plurality of data signals. In some cases, each of the plurality of data signals may be shifted by a different first phase shift amount. In other cases, however, two or more of the plurality of data signals may be shifted by a similar first phase shift amount. In this manner, data generation circuit 120 advantageously provides a plurality of data signals each having an independently programmable first phase shift amount. Such a programmable first phase shift amount may be calibrated during manufacturing of the synchronous system, or alternatively, by an end user of the synchronous system.

Figure 6:
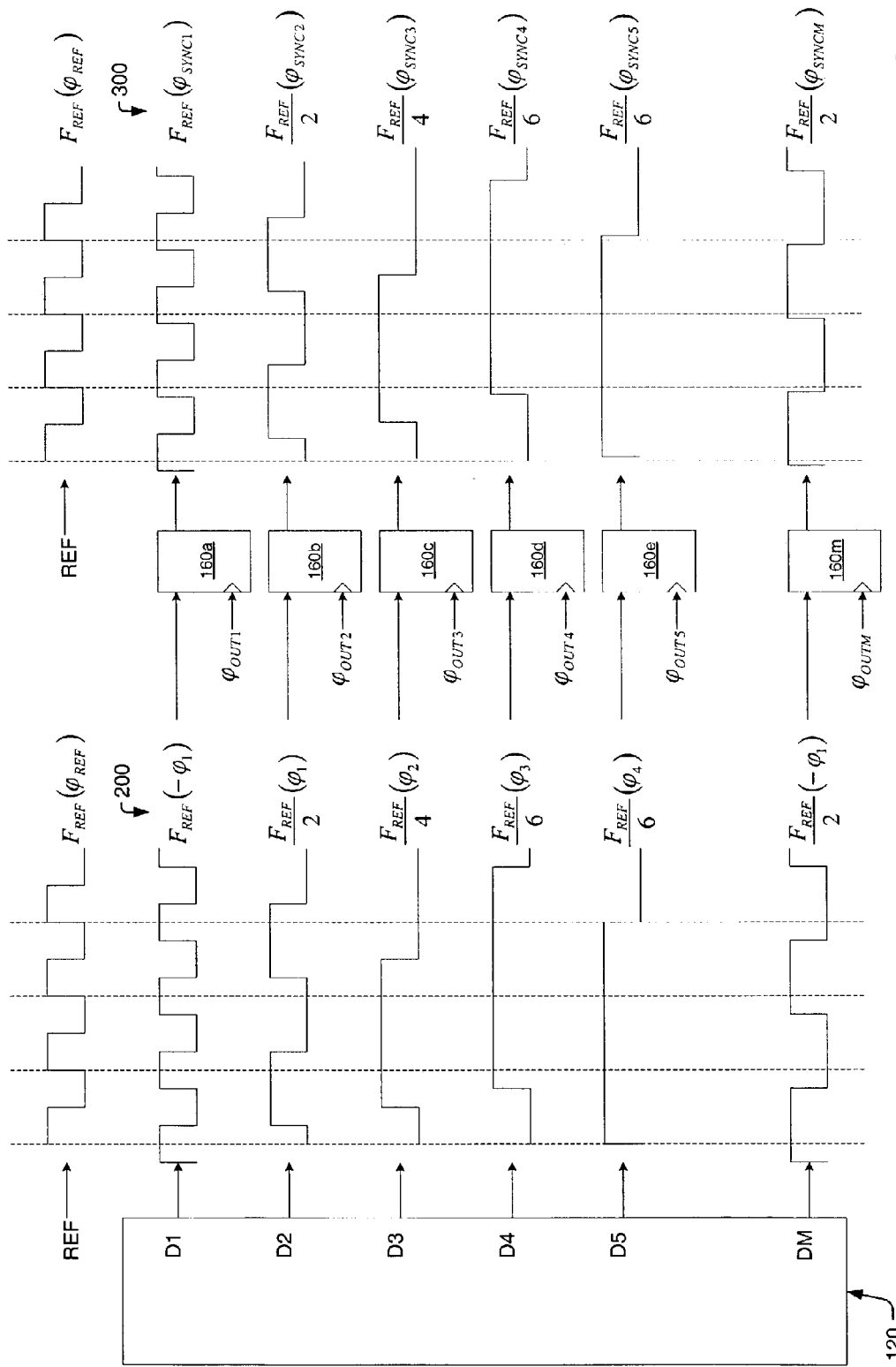
FIG. 6 is a timing diagram illustrating one example by which a plurality of signals may be shifted, independent of one another, in a two-step phase shifting process.

As shown in FIG. 4A, data generation circuit 120 may also include one or more dividers 124. In general, dividers 124 allow each of the plurality of data signals to be generated having an independently programmable frequency. In particular, dividers 124 may receive at least one of the subset of time delay pulses from phase generator 110. As such, the at least one of the subset of time delay pulses may have a frequency substantially equal to the reference clock frequency, $F_{REF}$. In addition, dividers 124 may each be configured to divide the reference frequency by an integer multiple of a number, $R_i$ (where i=1 ... m), based upon the first set of control signals received from control circuitry 130. As will be described in more detail below, data signal D2 of FIG. 6 illustrates an example in which the reference clock frequency is divided by an integer multiple of R substantially equal to 2. Note, however, that any number R may be used to generate the one or more frequencies corresponding to the plurality of data signals.

In some cases, dividers 124 may be configured such that each of the plurality of data signals is generated having a different frequency, as shown in FIG. 6. In other cases, however, dividers 124 may be configured such that two or more of the plurality of data signals are generated having a similar frequency. In yet other cases, dividers 124 may be configured such that each of the plurality of data signals is generated having a frequency substantially equal to an operating frequency of a different one of system components 40, as shown in FIG. 1. In this manner, data generation circuit 120 advantageously provides a plurality of data signals each having a programmable frequency. Such a programmable frequency may be calibrated during manufacturing of the synchronous system, or alternatively, by an end user of the synchronous system.

In addition, data generation circuit 120 is configured to output the plurality of data signals by clocking latches 128 with respective first phase shift amounts. In some cases, data generation circuit 120 may include delay elements 126. In particular, delay elements 126 may be coupled to slightly adjust the timing of latches 128 to compensate for timing delays that may be introduced by the circuitry of phase shift apparatus 20. In such a case, delay elements 126 may be coupled to receive optional feedback signal 90, as described above in reference to FIG. 1.

Returning to FIG. 2, phase shift apparatus 20 also includes a plurality of phase shift circuits 150. In general, the plurality of phase shift circuits 150 are each configured to receive the plurality of time delay pulses generated by phase generator 110. In addition, the plurality of phase shift circuits 150 are each configured to select at least two of the plurality of time delay pulses to be combined in a phase mixing process. "Phase mixing", as described herein, produces an output signal based on an interpolation of two signals that are phase offset from one another. In other words, phase mixing may be accomplished by determining a weighted average of at least two of the plurality of time delay pulses.

In this manner, the plurality of phase shift circuits 150 are configured to produce a plurality of output signals (i.e., $\phi_{OUT1}, \phi_{OUT2} \ldots \phi_{OUTM}$) each of which is a weighted average of at least two time delay pulses, for clocking output latches 160. As such, the plurality of phase shift circuits 150 are configured to further shift the previously shifted plurality of data signals by a second phase shift amount. In some cases, the second phase shift amount may be different for each of the previously shifted plurality of data signals. In other cases, however, the second phase shift amount may be similar for at least two of the previously shifted plurality of data signals. As will be described in more detail below in reference to FIG. 6, the second phase shift amounts are preferably selected to shift the plurality of data signals by a substantially smaller amount than the previously selected first phase shift amounts.

As stated above, phase generator 110 generally includes N number of stages for generating N number of time delay pulses. In some cases, phase generator 110 may include N=2 stages for generating a minimum number of time delay pulses needed to provide "quadrature signals" for phase mixing. Using quadrature signals typically results in phase vectors being 90° apart, such as 0°, 90°, 180° and 270°, which advantageously allows weighting factors to be determined according to well-known mathematical relationships. In other cases, however, phase generator 110 may preferably include N=4 stages to ensure adequate gain within the phase generator feedback loop while maintaining the provision of quadrature signals. Alternatively, phase generator 110 may include an arbitrary number of stages where N is substantially greater than 1.

In general, each of the plurality of phase shift circuits 150 includes MUX 152, MUX 154, weighting circuitry 156 and phase mixer 158, as shown within phase shift circuit 150a. Therefore, such circuit elements will be described herein with reference to phase shift circuit 150a for the sake of brevity. In particular, phase shift circuit 150a includes MUX 152 and MUX 154 for selecting at least two of the plurality of time delay pulses (i.e., $\phi_X$ and $\phi_Y$) generated by phase generator 110. Phase shift circuit 150a also includes weighting circuitry 156 for selecting a weight factor, K, and phase mixer 158 for determining the weighted average of the selected time delay pulses, $\phi_X$ and $\phi_Y$. Weighting circuitry 156 and phase mixer 158 will be described in more detail below in reference to FIG. 5.

In addition, phase shift circuit 150a is preferably configured to receive a second set of control signals from control circuitry 130. As such, the second set of control signals may be used to programmably select the at least two time delay pulses, $\phi_X$, and $\phi_Y$, and to programmably select the weight factor, K. In this manner, phase shift circuit 150a advantageously provides an output signal having a programmable second phase shift amount. Such a programmable second phase shift amount may be calibrated during manufacturing of the synchronous system, or alternatively, by an end user of the synchronous system.

Figure 5:
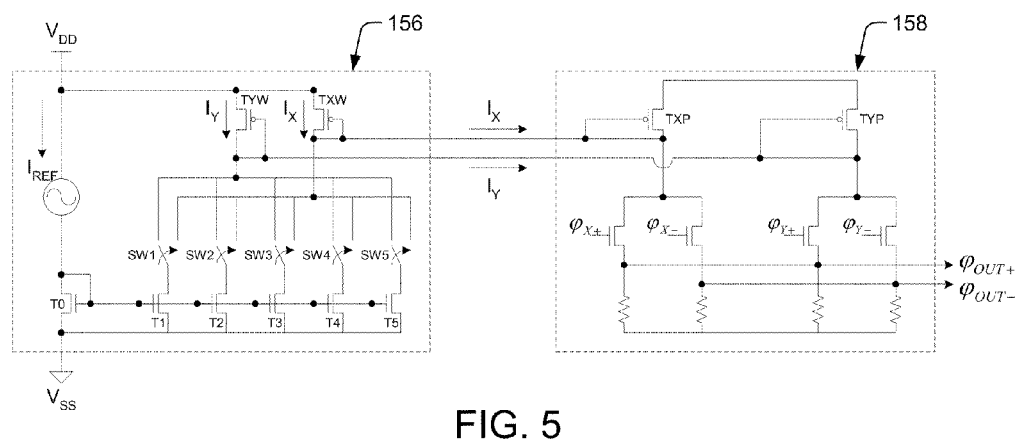
FIG. 5 is a block diagram illustrating an exemplary weighting circuit and an exemplary phase mixing circuit, as included within the phase shift apparatus of FIGS. 2 and 3.

FIG. 5 illustrates an exemplary circuit implementation of weighting circuitry 156 and phase mixer 158. In general, weighting circuitry 156 may be implemented as a digital-to-analog (D/A) converter, in some cases. In such a case, weighting circuitry 156 may provide a weight factor having a resolution dependent on the number of transistors, or the number of bits, B, included within weighting circuitry 156. In the example of FIG. 5, weighting circuitry 156 exhibits a 5-bit resolution corresponding to the five transistors (i.e., transistors T1, T2, T3, T4 and T5) coupled in a common gate configuration to transistor T0. In other examples, weighting circuitry 156 may alternatively include a substantially lower or substantially higher resolution dependent on the specifications of a particular synchronous system.

In particular, transistors T1, T2, T3, T4 and T5 are fabricated having substantially identical channel lengths for matching purposes. To distinguish a size difference, however, transistors T1, T2, T3, T4 and T5 are each fabricated having a unique channel width that is a different multiple of transistor T0 channel width. In this manner, a ratio of the width of one of transistors T1, T2, T3, T4 and T5 to the width of transistor T0 determines the amount of current flowing through the one transistor. If load transistor T0 exhibits a channel width, x, for example, the channel widths of transistors T1, T2, T3, T4 and T5 may be approximately 1x, 2x, 4x, 8x, and 16x, respectively. Alternatively, the channel widths of transistors T1, T2, T3, T4 and T5 may include any other variation in widths dependent on the specifications of a particular synchronous system.

In addition, a terminal of transistors T1, T2, T3, T4 and T5 may be coupled to a respective switching element (i.e., switches SW1, SW2, SW3, SW4 and SW5) within weighting circuitry 156. In turn, switching elements SW1, SW2, SW3, SW4 and SW5 may be controlled by the second set of control signals received from control circuitry 130. In this manner, a unique weight factor may be chosen (i.e., $K_X$ and $K_Y$) for each of the selected time delay pulses (i.e., $\phi_X$ and $\phi_Y$) by selectively controlling the position of switching elements SW1, SW2, SW3, SW4 and SW5. As such, weighting circuitry 156 may be configured to provide a number of unique weight factors substantially equal to $2^B$, where as stated above, B is the number bits in the D/A converter. In this manner, weighting circuitry 156 is configured to provide a weight factor resolution substantially equal to $1/(2^B)$.

In particular, the level of currents, $I_X$ and $I_Y$ flowing through transistors TXW and TYW, respectively, are used to determine the unique weight factors, $K_X$ and $K_Y$. As shown in FIG. 5, phase mixer 158 may be coupled to receive the currents, $I_X$ and $I_Y$ for applying the weight factors, $K_X$ and $K_Y$, to the selected time delay pulses, $\phi_X$ and $\phi_Y$. In this manner, phase mixer 158 may be implemented as a differential mixing amplifier configured to provide differential output signals, $\phi_{OUT+}$ and $\phi_{OUT-}$ in some cases. In some cases, differential output signals may be used to reduce the amount of noise within phase mixer 158. In some cases, the differential output signals, $\phi_{OUT+}$ and $\phi_{OUT-}$, may be expressed as:

$$\varphi_{OUT+} = \frac{I_X(\varphi_{X+}) + I_Y(\varphi_{Y+})}{I_{REF} \sum width} \text{ and}$$

$$\varphi_{OUT-} = \frac{I_X(\varphi_{X-}) + I_Y(\varphi_{Y-})}{I_{REF} \sum width}$$

where the 'width' variable represents the channel width of transistors T1, T2, T3, T4 and T5 normalized to the channel width of transistor T0. In this manner, phase mixer 158 is configured to provide a programmable second phase shift amount by "phase mixing" the selected time delay pulses according to a weighted average of the selected time delay pulses.

Such a phase mixing process allows phase shift apparatus 20 to provide a phase resolution (i.e., an incremental phase shift amount), which is inversely proportional to the operating frequency ($F_{VCO}$) of phase generator 110, the number of stages (N) included within phase generator 110, and the number of unique weight factors ($2^B$) weighting circuitry 156 is capable of producing. For example, if phase generator 110 includes a 4-stage oscillator running at 800 MHz and weighting circuitry 156 includes a 5-bit D/A converter, phase shift apparatus 20 is adapted to provide a phase resolution of approximately 9.7 picoseconds (i.e., $=1/(800 \text{ MHz} \times 4 \times 2^5)$).

In addition, the phase resolution of phase shift apparatus 20 may be increased by increasing the operating speed of phase generator 110, increasing the number of stages within phase generator 110, and/or increasing the number of bits within D/A converter 156. If the number of D/A bits were increased to 7, for example, phase shift apparatus 20 would provide a phase resolution of approximately 2.4 picoseconds (i.e., =1/(800 MHz×4×$2^7$)). In this manner, phase shift apparatus 20 advantageously provides a phase resolution, which is at least an order of magnitude greater than the phase resolution commonly found in conventional solutions (e.g., about 50 picoseconds to about 150 picoseconds). Thus, the phase shift apparatus described herein beneficially provides a programmable phase resolution, which allows accurate control of timing delays within synchronous systems, while enabling the synchronous systems to operate at higher frequencies using the same components.

Furthermore, the phase resolution of phase shift apparatus 20 may be decreased by decreasing the operating speed of phase generator 110, decreasing the number of stages within phase generator 110, and/or decreasing the number of bits within D/A converter 156. If the operating speed of phase generator 110 were decreased to 1 MHz, for example, phase shift apparatus 20 would provide a phase resolution of approximately 7.8 nanoseconds (i.e., =1/(1 MHz×4×$2^5$)). In this manner, phase shift apparatus 20 beneficially provides a phase resolution for accurate control of timing delays within synchronous systems having significantly low operating frequencies. Thus, the phase shift apparatus described herein is configured to provide substantially any phase resolution, which is necessary for accurate control of timing delays within synchronous systems operating at substantially any frequency.

Figure 3:
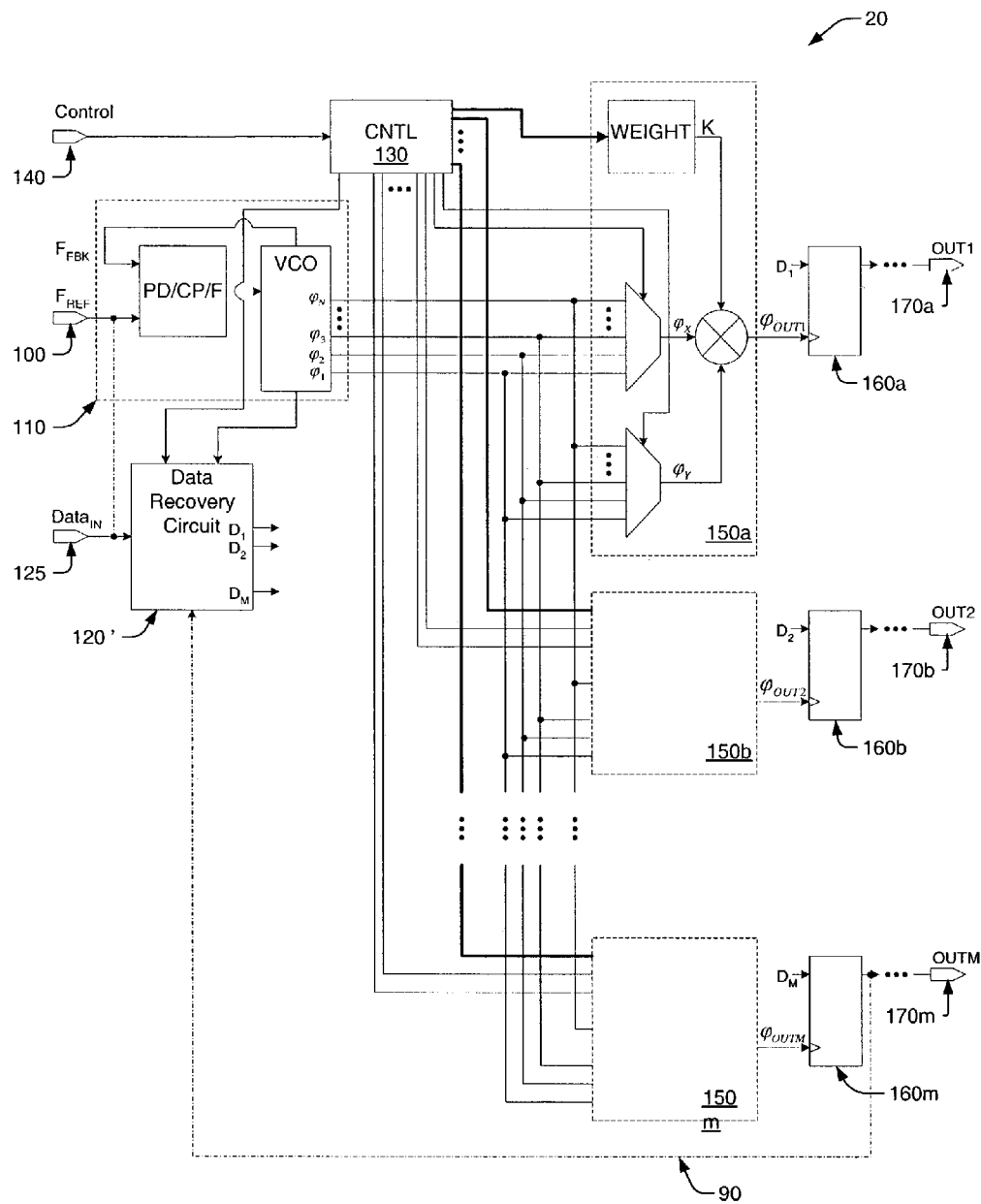
FIG. 3 is a block diagram illustrating another embodiment of a phase shift apparatus for adjusting a phase relationship of a plurality of data signals to be received by the plurality of system components of FIG. 1.
Figure 4B:
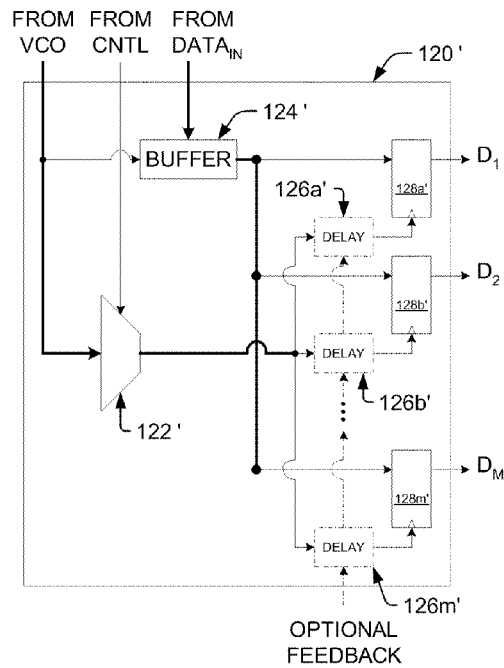
FIG. 4B is a block diagram illustrating an exemplary data recovery circuit, as included within the phase shift apparatus of FIG. 3.

An alternative embodiment of a synchronous system is described herein in reference to FIGS. 1, 3 and 4B. In such an alternative embodiment, synchronous system 10 may be implemented, for example, within a communications system or network. As such, data may be transferred from transmitting to receiving portions of the communications system in response to a clock transition. As shown in FIG. 1, phase shift apparatus 20 may be implemented as a transmitter and system components 40 may be implemented as a receiver, in some cases. In such a case, a plurality of data signals may be transferred from phase shift apparatus 20 to system components 40 across one or more transmission lines 30. In other cases, however, phase shift apparatus 20 may be implemented as a receiver for subsequently transferring the received plurality of data signals to system components 40 via one or more trace conductors 30. Note, however, that description of certain elements in FIGS. 1, 3 and 4B having reference numerals similar to those described above may be found by referring to the detailed description of FIGS. 1, 2 and 4A.

In the alternative embodiment, phase shift apparatus 20 may be a data interface circuit configured to receive, via data receiver 70, a plurality of data signals transmitted in either a serial or parallel format from a data transmitter (not shown). As such, data receiver 70 may be implemented as a buffer, or alternatively, as a plurality of buffers for receiving the plurality of data signals in either a serial or parallel data format, respectively. In any case, the plurality of data signals may exhibit dissimilar transition times due to, for example, clock skew, data skew and/or jitter. By adjusting the phase of each of the plurality of data signals independent of one another, the plurality of data signals can be accurately sampled by system components 40. Such a phase adjustment is accomplished in a manner similar to that described above in FIGS. 2 and 5 and below in FIG. 6. As such, the data interface circuit advantageously provides error-free data transmission regardless of unpredictable timing delays along the clock and/or data paths.

A simplified circuit diagram representing the alternative embodiment of phase shift apparatus 20 is illustrated in FIG. 3. In general, FIG. 3 illustrates phase shift apparatus 20 as an exemplary implementation of a data interface circuit. In particular, the embodiment of FIG. 3 differs from that of FIG. 2 in the replacement of data generation circuit 120 with data recovery circuit 120'. Data recovery circuit 120' is coupled to receive the plurality of data signals from data receiver 70 via $DATA_{IN}$ input pins 125. As such, $DATA_{IN}$ input pins 125 may be implemented as one or more input pins associated with, for example, an Ethernet, fiber channel or other serial bit stream receiver, in some cases. In other cases, however, $DATA_{IN}$ input pins 125 may be implemented as any number of I/O pins necessary to receive the plurality of data signals in substantially any data format.

In addition, data recovery circuit 120' may be configured to receive a subset of the plurality of time delay pulses generated by phase generator 110, in some cases. Such a subset may be similar to the subsets described above and may include, in one example, a number of phases separated by 90° (e.g., phases 0°, 90°, 180° and 270°). Furthermore, data recovery circuit 120' may be configured to receive a first set of control signals from control circuitry 130. As stated above in reference to FIG. 2, control circuitry 130 may be coupled to receive the first set of control signals via control input pins 140.

FIG. 4B illustrates an exemplary implementation of data recovery circuit 120'. As shown in FIG. 4B, data recovery circuit 120' may include one or more buffers 124'. In general, buffers 124' may be configured to receive the plurality of data signals from $DATA_{IN}$ input pins 125. In addition, buffers 124' may receive at least one of the subset of time delay pulses from phase generator 110. As such, the at least one of the subset of time delay pulses may be used to clock the plurality of data signals into buffers 124', in some cases. Alternatively, buffers 124' may not be included within data recovery circuit 120'. In general, the plurality of data signals may be received having substantially any frequency or plurality of frequencies.

As shown in FIG. 4B, data recovery circuit 120' may also include multiplexor (MUX) 122' for receiving the subset of time delay pulses from phase generator 110. Based upon a first set of control signals received from control circuitry 130, MUX 122' is configured to select, from the subset of time delay pulses, a first phase shift amount to be applied to the plurality of data signals. In this manner, the plurality of data signals may be independently shifted by similar or dissimilar first phase shift amounts. Thus, data recovery circuit 120' advantageously shifts the plurality of data signals by programmable first phase shift amounts.

In addition, data recovery circuit 120' is configured to output the plurality of data signals by clocking latches 128' with respective first phase shift amounts. As such, data recovery circuit 120' may include delay elements 126', in some cases, to compensate for timing delays that may be introduced by the circuitry of phase shift apparatus 20. As stated above, delay elements 126' may be configured to maintain setup and hold timing requirements of output latches 160 (as shown in FIG. 3) by adjusting the timing of latches 128'.

Returning to FIG. 3, phase shift apparatus 20 also includes a plurality of phase shift circuits 150 similar to those described above in reference to FIG. 2. As such, the plurality of phase shift circuits 150 are each coupled to receive the plurality of time delay pulses generated by phase generator 110. In some cases, the time delay pulses may be generated relative to a reference phase ($\phi_{REF}$) supplied, for example, by reference clock 50 via input pins 100. In other cases, however, the time delay pulses may be generated relative to a phase of one of the data signals received from $DATA_{IN}$ input pins 125.

The plurality of phase shift circuits 150 are also coupled to receive the second set of control signals from control circuitry 130. Based upon the received control signals, phase shift circuits 150 are each configured to programmably select at least two of the plurality of time delay pulses to be combined in a "phase mixing" process, as described above in reference to FIGS. 2 and 5. In this manner, phase shift circuits 150 are each configured to shift the previously shifted plurality of data signals by a programmable second phase shift amount.

Therefore, the phase shift apparatus of the alternative embodiment is configured to provide error-free data transmission by shifting, independent of one another, the plurality of data signals received from DATA$_{IN}$ input pins 125. As described above, the plurality of data signals may be shifted by similar or dissimilar first phase shift amounts prior to being shifted by similar or dissimilar second phase shift amounts. As such, the first and second phase shift amounts are programmably selected to compensate for skew and/or jitter that may be present within the plurality of received data signals.

An exemplary embodiment of a method for synchronizing output signals upon a plurality of system components may also be described in reference to FIGS. 1-3 and 6. In general, FIG. 6 is a timing diagram illustrating the two-step phase shifting process, as described above in FIGS. 1-3. In general, the method includes generating a plurality of time delay pulses. As stated above, the plurality of time delay pulses may be generated by a phase generator, such as a PLL, a DLL, or any other oscillating device capable of producing a plurality of signals having an offset phase relationship.

In addition, the method may include phase shifting one or more of a plurality of data signals independent of one another. As shown in FIG. 2, the plurality of data signals may be generated by data generation circuit 120, in some embodiments. As shown in FIG. 3, however, the plurality of data signals may be received by data recovery circuit 120', in other embodiments. FIG. 6 illustrates one example, according to either embodiment, in which one or more of the plurality of data signals, $D_1, D_2 \ldots D_M$, are phase shifted independent of one another to produce one or more shifted data signals 200. As stated above, each of the plurality of data signals may be programmably selected to have a similar or dissimilar frequency, in some cases. As such, shifted data signals 200 are illustrated in FIG. 6 as each having a different frequency for the sake of brevity.

In some cases, the step of phase shifting one or more data signals includes selecting, from a subset of the plurality of time delay pulses, at least one time delay pulse by which to phase shift at least one of the plurality of data signals. As stated above, the subset of time delay pulses, $\phi_1, \phi_2, \phi_3$ and $\phi_4$, may include, in some cases, a number of phases separated by 90°, such as phases 0°, 90°, 180° and 270°, respectively. In other cases, however, the subset of the time delay pulses may include a number of phases separated by one or more dissimilar phase amounts. In any case, the number of phases and the separation between phases may provide a "coarse" phase shift amount by which to shift the one or more data signals. In general, such a "coarse" phase shift amount may be programmably selected based on the specifications of a particular synchronous system. In addition, the one or more phases selected from the subset may be used to respectively shift the one or more data signals in either a positive direction (as illustrated in shifted data signals $D_2$ through $D_5$) or a negative direction (as illustrated in shifted data signals $D_1$ and $D_M$).

Furthermore, the method may include generating one or more output signals 300 by further phase shifting, independent of one another, previously shifted data signals 200. In some cases, the step of generating an output signal includes determining a weighted average of at least two of the plurality of time delay pulses to further phase shift one of the previously shifted data signals 200 by the weighted average. The plurality of output signals may be generated by phase shift circuits 150, as described above in reference to FIGS. 2, 3 and 5. As shown in FIG. 6, output latches 160 are configured to further shift the plurality of data signals by respective second phase shift amounts, $\phi_{OUT1} \ldots _{OUTM}$ corresponding to the weighted averages calculated for each of the plurality of data signals. As stated above, the second phase shift amounts may be programmably selected based on the specifications of a particular synchronous system.

In some cases, the second phase shift amounts may be selected to shift the plurality of data signals by a substantially larger amount than respective first phase shift amounts. In other cases, however, the second phase shift amounts may preferably be selected to shift the plurality of data signals by a substantially smaller amount than respective first phase shift amounts. As shown in FIG. 6, for example, data signal $D_1$ is shifted by a first phase shift amount substantially equal to negative 90° and then further shifted by a second phase shift amount substantially equal to positive 45°. In this manner, the increased phase resolution of phase shift circuits 150 advantageously provides a "fine" phase shift amount by which to further shift the one or more data signals.

By fine-tuning the amount by which the one or more data signals are shifted, the method described herein is adapted to eliminate any timing delay mismatches that may exist between one or more components of a synchronous system. For example, the method described herein may compensate for any timing delay mismatches by shifting the data signals by "coarse" phase shift amounts prior to shifting the data signals by "fine" phase shift amounts. In this manner, the method described herein guarantees accurate sampling of the data signals by the one or more system components. Thus, the method described herein advantageously provides a two-step phase shifting process for synchronizing output signals upon one or more system components.

It will be appreciated to those skilled in the art having the benefit of this disclosure that this invention is believed to provide a phase shift apparatus, system and method for synchronizing output signals upon one or more system components. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A phase shift apparatus, comprising:
   a phase generator coupled for receiving a clock signal and generating a plurality of time delay pulses in response thereto;
   a first phase shift circuit configured to shift a plurality of signals by a first phase amount selected from a subset of the plurality of time delay pulses; and
   a second phase shift circuit configured to further shift at least one of the shifted plurality of signals by a second phase amount comprising a weighted average of at least two of the plurality of time delay pulses.

2. The phase shift apparatus as recited in claim 1, wherein said first phase amount differs for each of said plurality of signals.

3. The phase shift apparatus as recited in claim 2, wherein said second phase amount differs for each of said plurality of signals.

4. The phase shift apparatus as recited in claim 1, wherein said first phase amount is similar for at least two of said plurality of signals.

5. The phase shift apparatus as recited in claim 2, wherein said second phase amount is similar for at least two of said plurality of signals.

6. The phase shift apparatus as recited in claim 1, wherein said phase generator comprises a voltage controlled oscillator or a delay line.

7. The phase shift apparatus as recited in claim 1, wherein said plurality of signals comprise a plurality of data signals received by the phase shift apparatus, and wherein at least two of the plurality of data signals are phase offset from each other.

8. The phase shift apparatus as recited in claim 1, wherein said plurality of signals comprise a plurality of data signals generated within the first phase shift circuit.

9. The phase shift apparatus as recited in claim 1, wherein the second phase shift circuit comprises at least two multiplexers for selecting the at least two of the plurality of time delay pulses and a mixer for combining the at least two plurality of time delay pulses with a weight factor.

10. The phase shift apparatus as recited in claim 1, further comprising a configuration register coupled to programmably select the at least two of the plurality of time delay pulses and to programmably select a weight factor for determining the weighted average.

11. The phase shift apparatus as recited in claim 1, further comprising a configuration register coupled to programmably select the first phase shift amount from the subset of the plurality of time delay pulses.

12. A system, comprising:
a phase shift apparatus that includes:
a data generation circuit configured to generate a plurality of data signals shifted independent of one another dependent on a plurality of time delay pulses output from a phase generator;
a plurality of phase shift circuits configured to further shift the shifted plurality of data signals according to a weighted average of at least two of the plurality of time delay pulses; and
a plurality of system components coupled to receive the further shifted plurality of data signals at approximately the same time, regardless of a dissimilar length of a plurality of trace conductors extending between the plurality of system components and the plurality of phase shift circuits.

13. The computer system as recited in claim 12, wherein the phase shift apparatus further comprises a configuration register coupled to supply a first set of programmable control signals to the data generation circuit and a second set of programmable control signals to the plurality of phase shift circuits.

14. The system as recited in claim 13, wherein based upon the first set of programmable control signals, the data generation circuit is configured to generate each of the plurality of data signals having a frequency equal to an operating frequency of a different one of the plurality of system components.

15. The system as recited in claim 14, wherein the data generation circuit is further configured to generate the plurality of data signals having a first phase shift amount based upon the first set of programmable control signals.

16. The system as recited in claim 13, wherein based upon the second set of programmable control signals, the plurality of phase shift circuits are configured to select the at least two of the plurality of time delay pulses and a weight factor for determining the weighted average used to further shift the shifted plurality of data signals.

17. A method for synchronizing output signals upon a pair of system components, comprising
phase shifting a pair of data signals independent of one another;
generating a pair of output signals by further phase shifting, independent of one another, the previously phase shifted pair of data signals;
supplying the pair of system components with said pair of output signals such that each of the pair of system components receives a transition of a corresponding output signal at substantially the same time.

18. The method as recited in claim 17, wherein prior to the step of phase shifting a pair of data signals, the method further comprises generating a plurality of time delay pulses.

19. The method as recited in claim 18, wherein the step of phase shifting a pair of data signals comprises selecting, from a subset of the plurality of time delay pulses, at least one time delay pulse for phase shifting at least one of the pair of data signals.

20. The method as recited in claim 18, wherein the step of generating a pair of output signals comprises determining a weighted average of at least two of the plurality of time delay pulses to further phase shift at least one of the previously phase shifted pair of data signals by the weighted average.

* * * * *